United States Patent [19]

Furutani et al.

[11] Patent Number: 5,668,511

[45] Date of Patent: Sep. 16, 1997

[54] LOW-PASS FILTER

[75] Inventors: Koji Furutani; Mitsuhide Kato; Teruhisa Tsuru, all of Nagaokakyo, Japan

[73] Assignee: Murata Manufacturing Co., Ltd., Japan

[21] Appl. No.: 623,512

[22] Filed: Mar. 28, 1996

Related U.S. Application Data

[63] Continuation of Ser. No. 408,377, Mar. 22, 1995, abandoned.

[30] Foreign Application Priority Data

Mar. 29, 1994 [JP] Japan ................................. 6-059085

[51] Int. Cl.$^6$ ........................................................ H01P 1/20
[52] U.S. Cl. ............................ 333/204; 333/185; 333/202
[58] Field of Search ................................. 333/202, 204, 333/205, 183

[56] References Cited

U.S. PATENT DOCUMENTS

| 2,812,501 | 11/1957 | Sommers | 333/238 |
| 5,140,497 | 8/1992 | Kato et al. | 333/202 |
| 5,323,128 | 6/1994 | Ishizaki et al. | 333/204 |
| 5,357,227 | 10/1994 | Tonegawa et al. | 333/204 |
| 5,396,201 | 3/1995 | Ishizaki et al. | 333/204 |

FOREIGN PATENT DOCUMENTS

| 0566145 | 10/1993 | European Pat. Off. . | |
| 0641035 | 3/1995 | European Pat. Off. . | |
| 4119551 | 1/1992 | Germany . | |
| 4401173 | 7/1994 | Germany . | |
| 5-218705 | 8/1993 | Japan | 333/204 |

OTHER PUBLICATIONS

European Search Report dated Jun. 28, 1995.

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A low-pass filter is obtained by inserting a third dielectric substrate having a shielding electrode on its upper surface between a first dielectric substrate having microstriplines on its upper surface and a second dielectric substrate having capacitor electrodes on its upper surface, stacking fourth and fifth dielectric substrates having ground electrodes on upper surfaces thereof on both sides of the first to third dielectric substrates, and stacking a dielectric sheet on the uppermost portion.

10 Claims, 6 Drawing Sheets

LOW-PASS FILTER

This is a continuation of application Ser. No. 08/408,377 filed on Mar. 22, 1995, now abandoned.

BACKGROUND OF THE INVENTION

1. Field of the Invention

The present invention relates to a low-pass filter which is applied to a high-frequency circuit, and more particularly, it relates to a low-pass filter employing a multilayered chip which is formed by stacking a plurality of dielectric layers on each other.

2. Description of the Background Art

A well-known low-pass filter is described with reference to FIGS. 5 and 6. FIG. 5 is an exploded perspective view showing a conventional low-pass filter 130, and FIG. 6 is a perspective view showing the appearance of this low-pass filter 130.

The low-pass filter 130 is formed of a multilayered chip, which is obtained by stacking dielectric substrates 103, 107, 110 and 111 and a dielectric sheet 112 on each other.

The dielectric substrate 103 is provided on its upper surface with microstriplines 101 and 102, which are in the form of folded straight lines. The dielectric substrate 107 is provided on its upper surface with capacitor electrodes 104 to 106. The dielectric substrates 103 and 107 are stacked between the dielectric substrates 110 and 111.

The dielectric substrates 110 and 111 are provided on upper surfaces thereof with ground electrodes 108 and 109 respectively.

This multilayered chip can be obtained by forming the aforementioned electrode structures on dielectric green sheets, thereafter stacking the green sheets on each other, and integrally firing the ceramic material on the electrode material. Alternatively, fired dielectric substrates may be used for the dielectric substrates 103, 107, 110 and 111 respectively.

External electrodes 113 to 116 are formed on first longer side surfaces of the dielectric substrates 103, 107, 110 and 111, respectively, and the dielectric sheet 112, while external electrodes 117 to 120 are formed on second side surfaces thereof respectively. As clearly understood from FIG. 6, these external electrodes 113 to 120 are formed on longer side surfaces of a multilayered chip 131 as assembled, while FIG. 5 shows the same in an exploded view.

As clearly understood from FIGS. 5 and 6, the ends of the microstripline 101 are electrically connected with the external electrodes 114 and 117 respectively. The ends of the external electrode 102 are electrically connected with the external electrodes 115 and 120 respectively. The capacitor electrode 104 is electrically connected with the external electrode 117, while the capacitor electrode 105 is electrically connected with the external electrode 120. Further, the capacitor electrode 106 is electrically connected with the external electrodes 114 and 115. In addition, the ground electrode 108 is electrically connected with the external electrodes 113, 116, 118 and 119, while the ground electrode 109 is also electrically connected with the external electrodes 113, 116, 118 and 119.

The microstriplines 101 and 102 are adapted to form inductance components, i.e., inductances L1 and L2, respectively, appearing in an equivalent circuit shown in FIG. 7.

Further, the capacitor electrodes 104 to 106 along with the ground electrode 109 form capacitors C1 to C3, respectively, appearing in the equivalent circuit shown in FIG. 7.

The dielectric sheet 112 is adapted to protect the ground electrode 108 which is provided on the dielectric substrate 110.

In this low-pass filter 130, the external electrodes 117 and 120 are employed as input and output leads respectively. Further, the external electrodes 113, 116, 118 and 119 are connected with the ground potential. The external electrode 114 is adapted to electrically connect the end of the microstripline 101 with the capacitor electrode 106. Similarly, the external electrode 115 is adapted to electrically connect an end of the microstripline 102 with the capacitor electrode 106.

When the external electrodes 117 and 120 are employed as input and output leads respectively and the external electrodes 113, 116, 118 and 119 are employed as portions connected to the ground potential, the low-pass filter 130 operates in accordance with the equivalent circuit shown in FIG. 7.

FIG. 8 shows the transmission characteristic of the low-pass filter 130. As clearly understood from FIG. 8, insertion loss is damped at the resonance frequency, and thereafter decreased in the frequency band above the resonance frequency. Such decrease of the insertion loss in the high frequency band occurs because high-frequency signals bypass the microstriplines 101 and 102 via floating capacitances which are developed across the microstriplines 101 and 102 respectively. Consequently, it is difficult to attenuate an unnecessary high-frequency signals.

In order to shift the passband of the low-pass filter 130 toward the lower frequencies, the resonance frequency of the low-pass filter 130 may be reduced. In order to reduce the resonance frequency, however, it is necessary to increase the lengths of the microstriplines 101 and 102 thereby increasing the values of the inductances L1 and L2, or to increase the areas of the capacitor electrodes 104 and 106 thereby increasing the electrostatic capacitances of the capacitors C1 to C3. In this case, the low-pass filter 130 is disadvantageously increased in size.

SUMMARY OF THE INVENTION

In order to solve the aforementioned problems of the prior art, an object of the present invention is to provide a low-pass filter which can increase the amount of high frequency damping of a signal passing through the low-pass filter by reducing the floating capacitance developed across a microstrip line, while miniaturizing the filter as a whole.

According to a broad aspect of the present invention, a low-pass filter is provided employing a multilayered chip obtained by stacking a plurality of dielectric layers on each other. This low-pass filter comprises a first dielectric substrate having a microstripline on its one surface, a second dielectric substrate which is provided with a capacitor electrode on its one surface, a third dielectric substrate which is provided with a shielding electrode on its one surface and which is arranged between the first and second dielectric substrates, a dielectric sheet which is directly or indirectly stacked on a first surface of a multilayer structure obtained by stacking the first to third dielectric substrates on each other, and a fourth dielectric substrate which is provided with a ground electrode on its one surface and stacked on a second surface of the multilayer structure which is opposite to the first surface, while the ground electrode is electrically connected with the shielding electrode.

In this case, a first capacitor is formed by the capacitor electrode and the ground electrode while a second capacitor is formed by the capacitor electrode and the shielding electrode, so that the second capacitor is connected in parallel with the first capacitor. As in the conventional low-pass filter, the microstripline forms an inductance.

In the low-pass filter according to the present invention, the third dielectric substrate having the shielding electrode is inserted between the first dielectric substrate having the microstripline for forming an inductance and the second dielectric substrate having the capacitor electrode, whereby it is possible to reduce a strong capacitance which is developed across the microstripline. Therefore, the amount of damping in the high frequency region can be increased for a signal passing through the low-pass filter, thereby effectively attenuating an unnecessary high-frequency signal.

Further, according to the present invention, the second capacitor is formed by the capacitor electrode and the shielding electrode so that the second capacitor is added, in parallel, to the first capacitor, thereby doubling the total electrostatic capacitance of the capacitors. Thus, it is possible to reduce the resonance frequency of the low-pass filter without increasing its size. When the low-pass filter is desired to maintain a constant resonance frequency, it is possible to provide a low-pass filter which is smaller in size than the conventional one.

According to a specific aspect of the present invention, a fifth dielectric substrate which is provided with a ground electrode on its one surface is inserted between the dielectric sheet and the first surface of the multilayer structure. Due to such insertion of the fifth dielectric substrate having the ground electrode, it is possible to effectively shield a principal part of the low-pass filter against external noises.

According to another specific aspect of the present invention, at least three external electrodes are formed on the outer surfaces of the multilayered chip, so that the at least three external electrodes are electrically connected with any of the electrodes of the microstripline, the capacitor electrode and the ground electrode, thereby forming a π filter.

According to the present invention, the electrical connection between the ground electrode and the shielding electrode may be attained through an external electrode which is formed on an outer surface of the multilayered chip. Alternatively, a via-hole electrode may be formed in the multilayered chip so that the ground electrode is electrically connected with the shielding electrode through this via-hole electrode.

Further, an end of the microstripline may be connected with the ground electrode through the via-hole electrode which is formed in the multilayered chip.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Some embodiments of the inventive low-pass filter are now described with reference to the drawings. The feature of the present invention resides in that a third dielectric substrate which is provided with a shielding electrode on its one surface is inserted between a first dielectric substrate which is provided with a microstripline and a second dielectric substrate which is provided with a capacitor electrode on its one surface.

Figure 1:
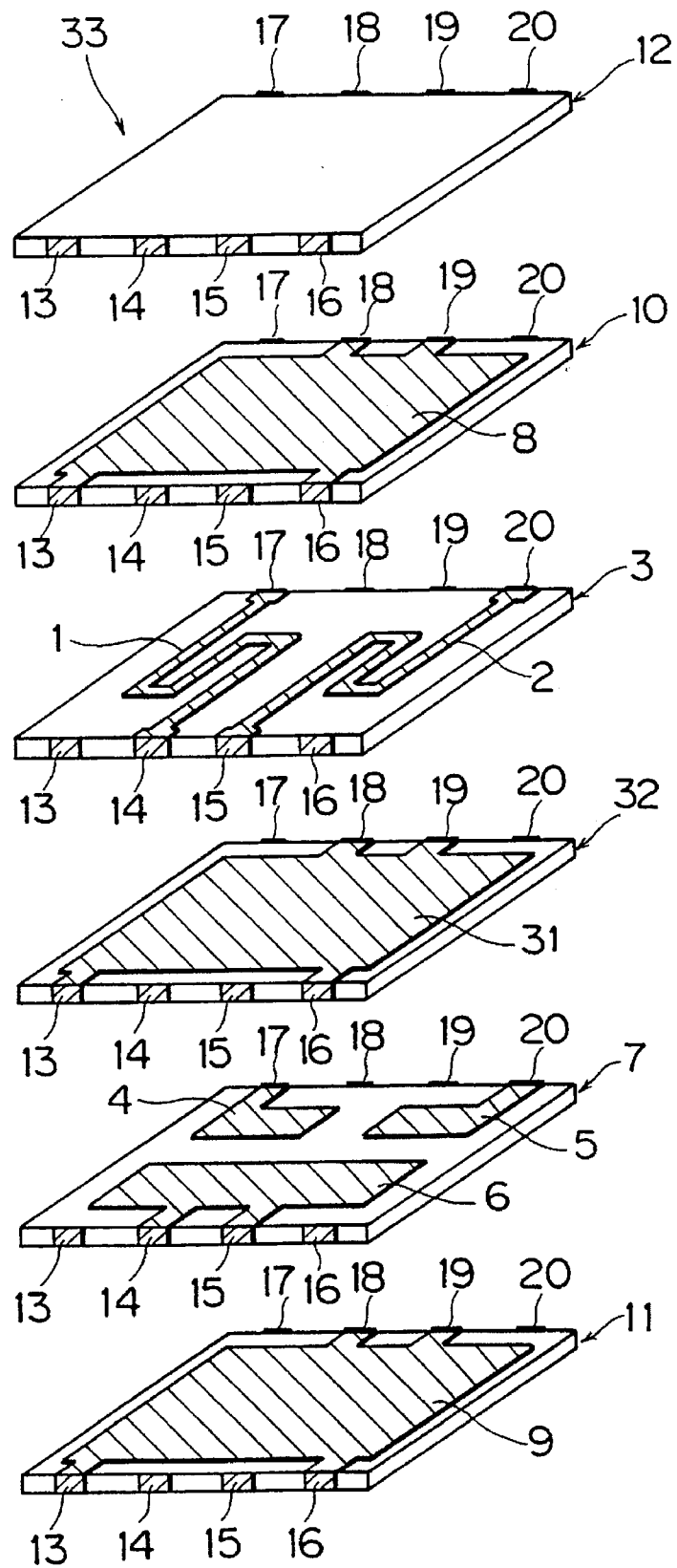
FIG. 1 is an exploded perspective view showing a low-pass filter according to a first embodiment of the present invention.
Figure 2:
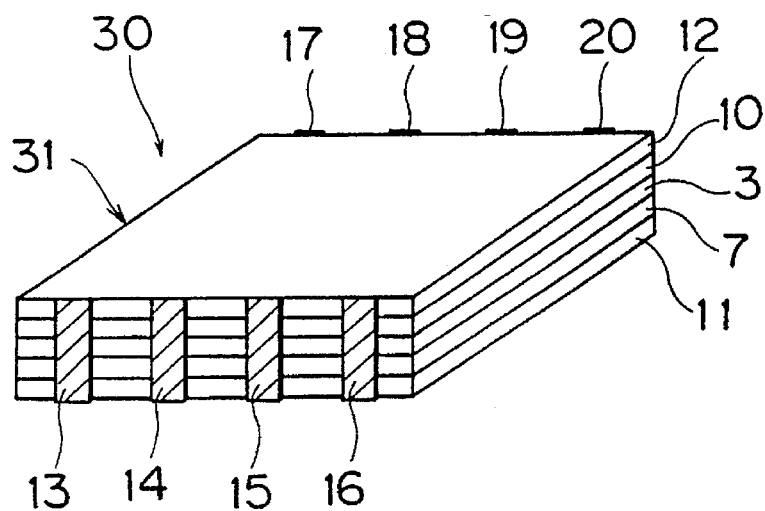
FIG. 2 is a perspective view showing the assembled low-pass filter according to the first embodiment of the present invention.

FIG. 1 is an exploded perspective view showing a low-pass filter 33 according to a first embodiment of the present invention, and FIG. 2 is a perspective view showing its assembled appearance.

As shown in FIG. 1, a first dielectric substrate 3, a second dielectric substrate 7, a third dielectric substrate 32, a fourth dielectric substrate 11, a fifth dielectric substrate 10, and a dielectric sheet 12 are stacked on each other to form a multilayered chip 34, thereby forming the low-pass filter 33 according to this embodiment.

The first dielectric substrate 3 is provided on its upper surface with microstriplines 1 and 2 which are in the form of folded straight lines. Capacitor electrodes 4 to 6 are formed on an upper surface of the second dielectric substrate 7. Further, a shielding electrode 31 is formed on an upper surface of the third dielectric substrate 32. In addition, ground electrodes 9 and 8 are formed on upper surfaces of the fourth and fifth dielectric substrates 11 and 10 respectively.

As clearly understood from FIG. 2, external electrodes 13 to 16 are formed on one longer side surface of the multilayered chip 34, while external electrodes 17 to 20 are formed on another side surface thereof. Referring to FIG. 1, these external electrodes 13 to 20 are illustrated in separated relationship on side surfaces of the dielectric substrates 3, 7, 10, 11 and 32 and the dielectric sheet 12 respectively.

The dielectric substrates 3, 7, 10, 11 and 32 can be formed by firing dielectric ceramic substrates or plates of another suitable dielectric material. Alternatively, the multilayered chip 34 may be obtained by applying conductive paste onto the upper surfaces of the dielectric ceramic green sheets for forming the respective electrodes, stacking the green sheets on each other and integrally firing the same.

Figure 7:
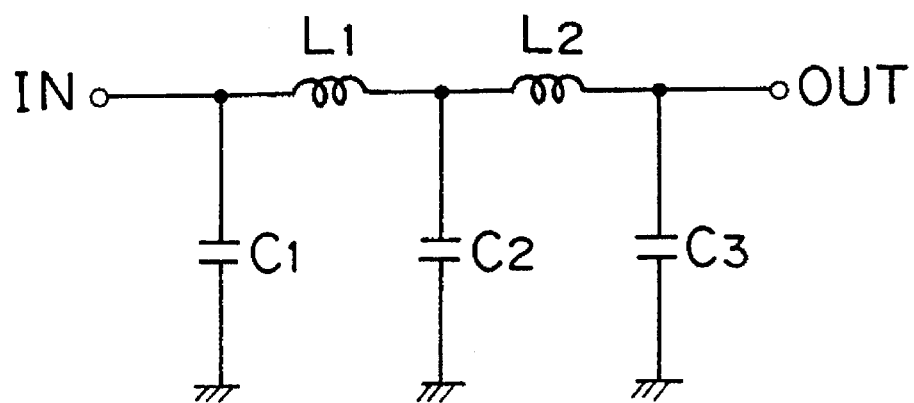
FIG. 7 is an equivalent circuit diagram of the low-pass filter shown in FIG. 4.
Figure 8:
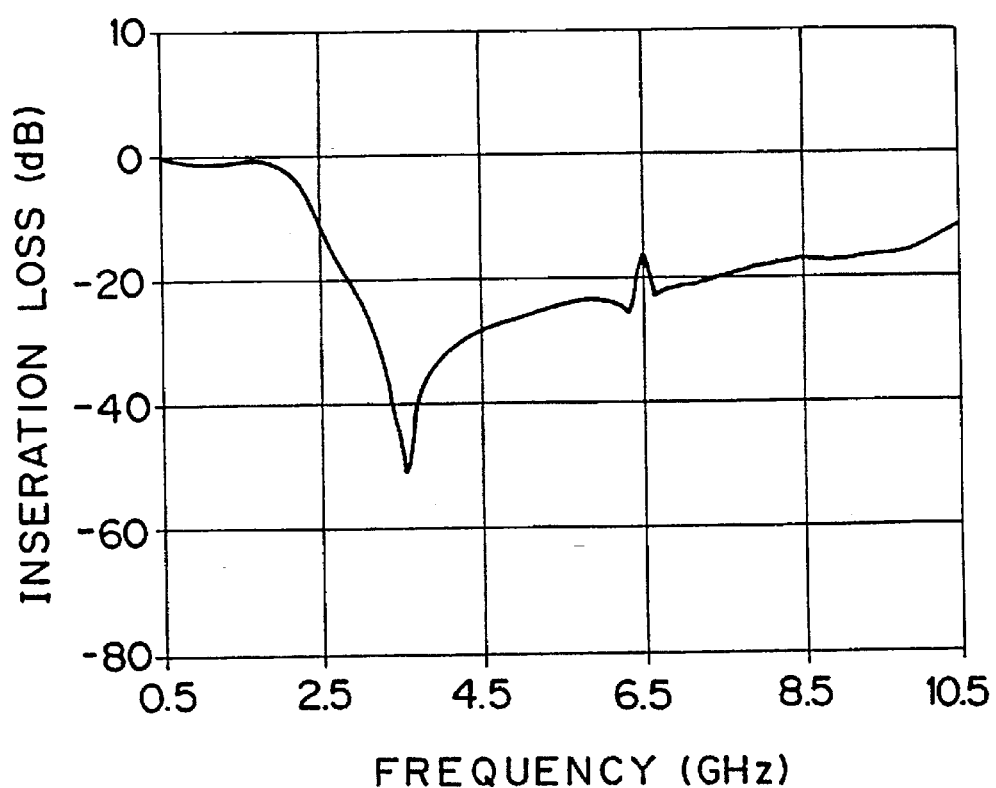
FIG. 8 illustrates the transmission characteristic of the low-pass filter shown in FIG. 5.

The of the microstripline 1 are electrically connected with the external electrodes 17 and 14 respectively, while the ends of the microstripline 2 are electrically connected with the external electrodes 15 and 20 respectively. The microstriplines 1 and 2 are adapted to form inductances L1 and L2, respectively, of the low-pass filter equivalent circuit shown in FIG. 7.

The capacitor electrodes 4 to 6 overlap with the ground electrode 9 through the dielectric substrate 7. Therefore, first capacitors are formed by the capacitor electrodes 4 to 6 and the ground electrode 9 respectively. Further, according to this embodiment, the capacitor electrodes 4 to 6 are opposed to the shielding electrode 31 through the dielectric substrate 32. Thus, second capacitors are formed by the capacitor electrodes 4 to 6 and the shielding electrode 31 respectively.

The shielding electrode 31 is electrically connected with the external electrodes 13, 16, 18 and 19. Similarly, the ground electrodes 9 and 8 are also electrically connected with the external electrodes 13, 16, 18 and 19.

In the low-pass filter 33 according to this embodiment, the external electrodes 17 and 20 are employed as input and output leads respectively, while the external electrodes 13, 16, 18 and 19 are connected with ground. Therefore, it is possible to implement a low-pass filter circuit which is similar to that formed by the LC circuit shown in FIG. 7. Further, according to this embodiment, in addition to the first capacitors which are formed by the capacitors 4 to 6 and the ground electrode 9 respectively, the second capacitors are formed by the capacitor electrodes 4 to 6 and the shielding electrode 31. Therefore, the respective second capacitors are added in parallel to the respective first capacitors, whereby electrostatic capacitances of the capacitors C1 to C3 are doubled as compared with the prior art shown in FIG. 5. Thus, it is possible to reduce the resonance frequency of the low-pass filter 33.

Figure 3:
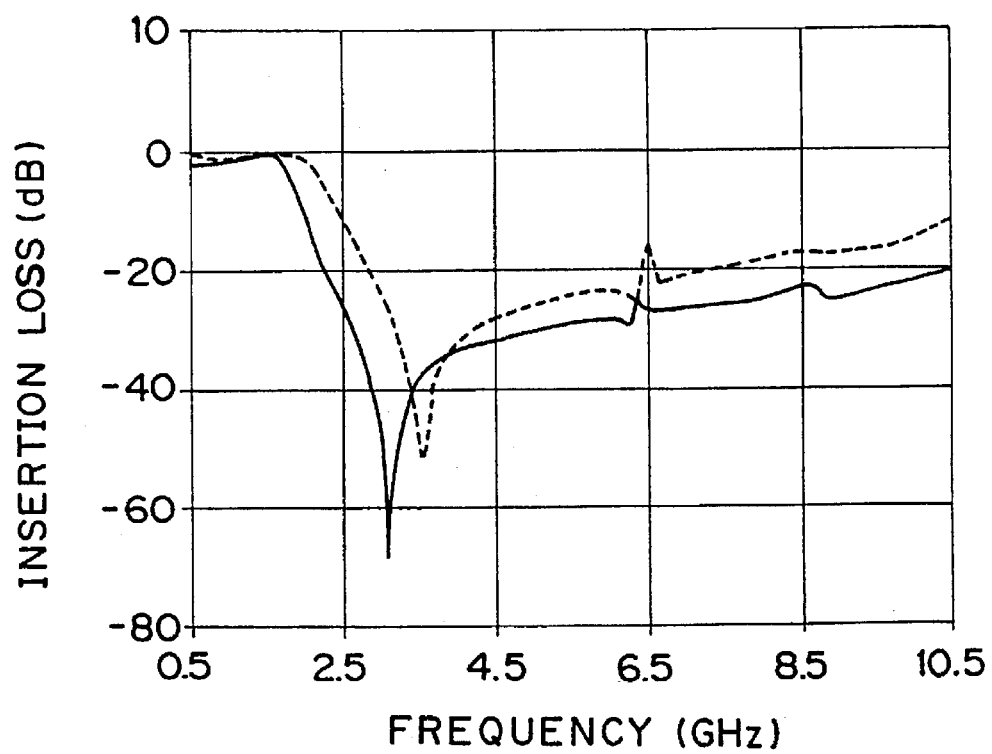
FIG. 3 illustrates the transmission characteristic of the low-pass filter shown in FIG. 1.
Figure 5:
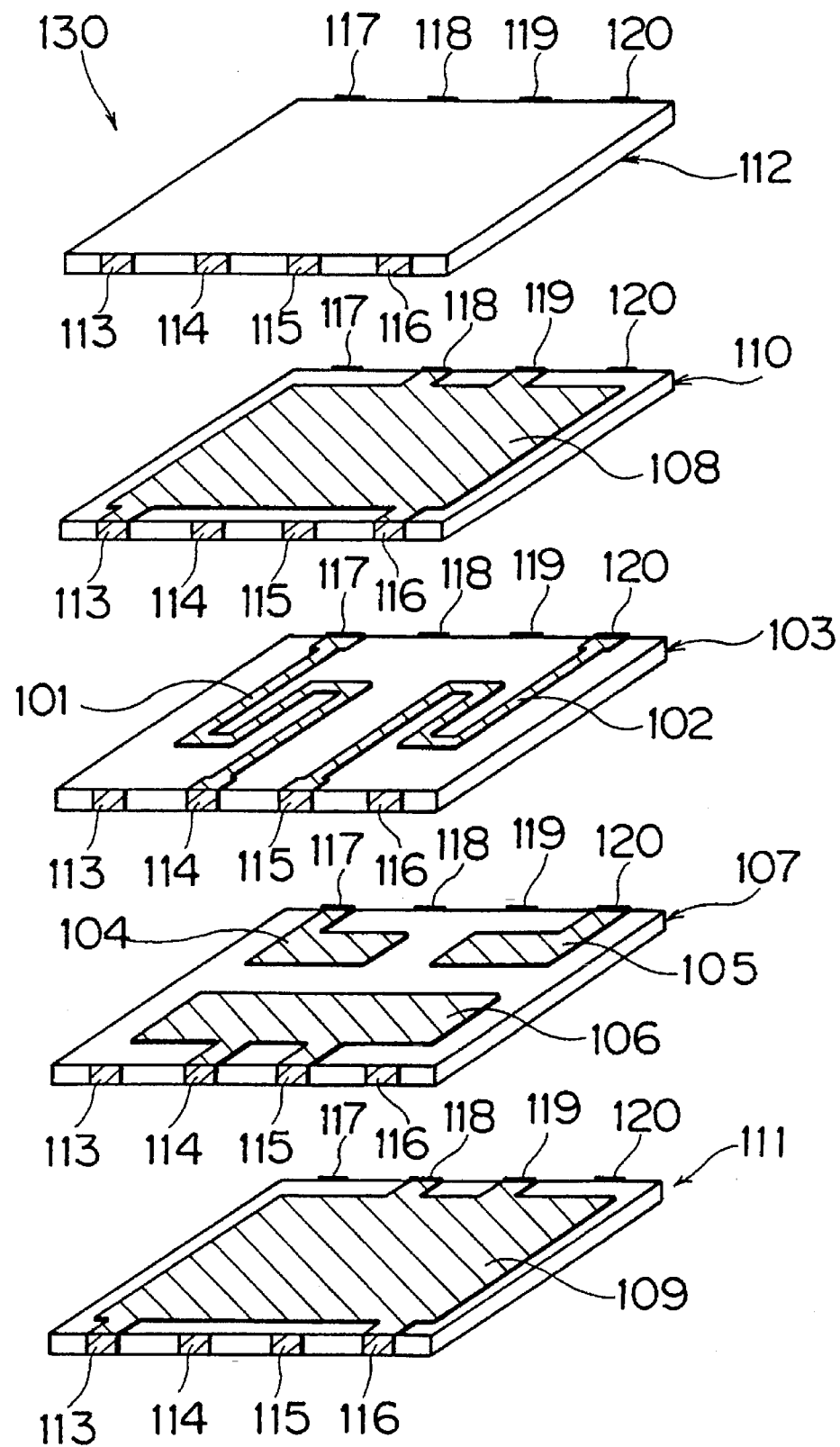
FIG. 5 is an exploded perspective view showing a conventional low-pass filter.
Figure 6:
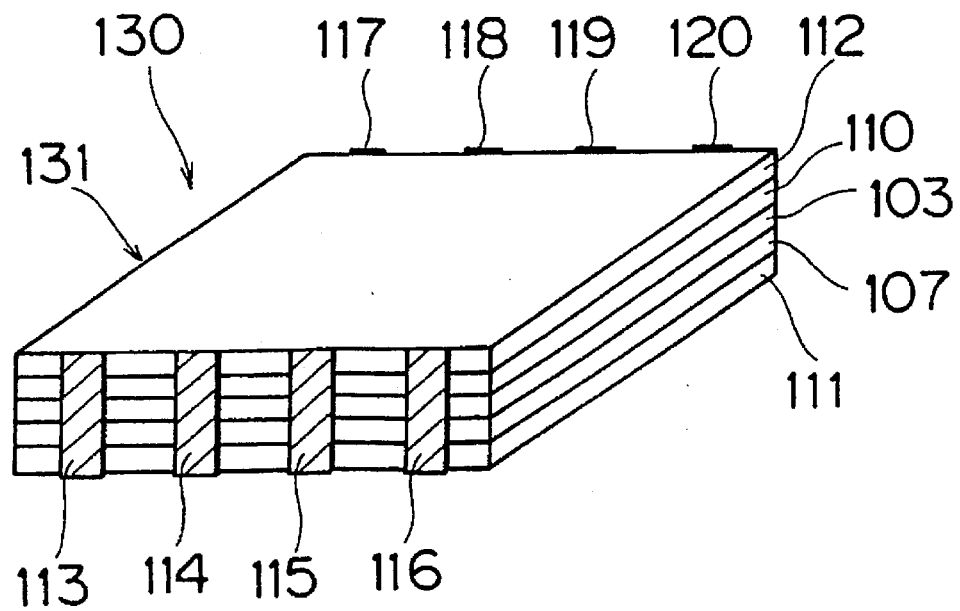
FIG. 6 is a perspective view showing the assembled low-pass filter shown in FIG. 5.

FIG. 3 shows the filter characteristic of the low-pass filter 33 according to this embodiment as a solid line, and that of the conventional filter shown as FIG. 5 in a broken line. It is clearly understood from FIG. 3 that the conventional low-pass filter only attains 20 dB of damping in the frequency band up to the frequency of 6.5 GHz. On the other hand, the low-pass filter 33 according to this embodiment can attain 20 dB of damping up to the frequency of 10.5 GHz.

Further, the resonance frequencies of the conventional low-pass filter and the low-pass filter 33 according to this embodiment are 2.2 GHz and 1.8 GHz respectively. Thus, it is possible to reduce the resonance frequency by 18% according to the present invention.

The fifth dielectric substrate 10 shown in FIG. 1 is simply used to shield the low-pass filter 33 against external noises, and not requisite for the present invention. Therefore, this dielectric substrate 10 may be omitted.

A low-pass filter 70 according to a second embodiment of the present invention is now described with reference to FIG. 4.

Figure 4:
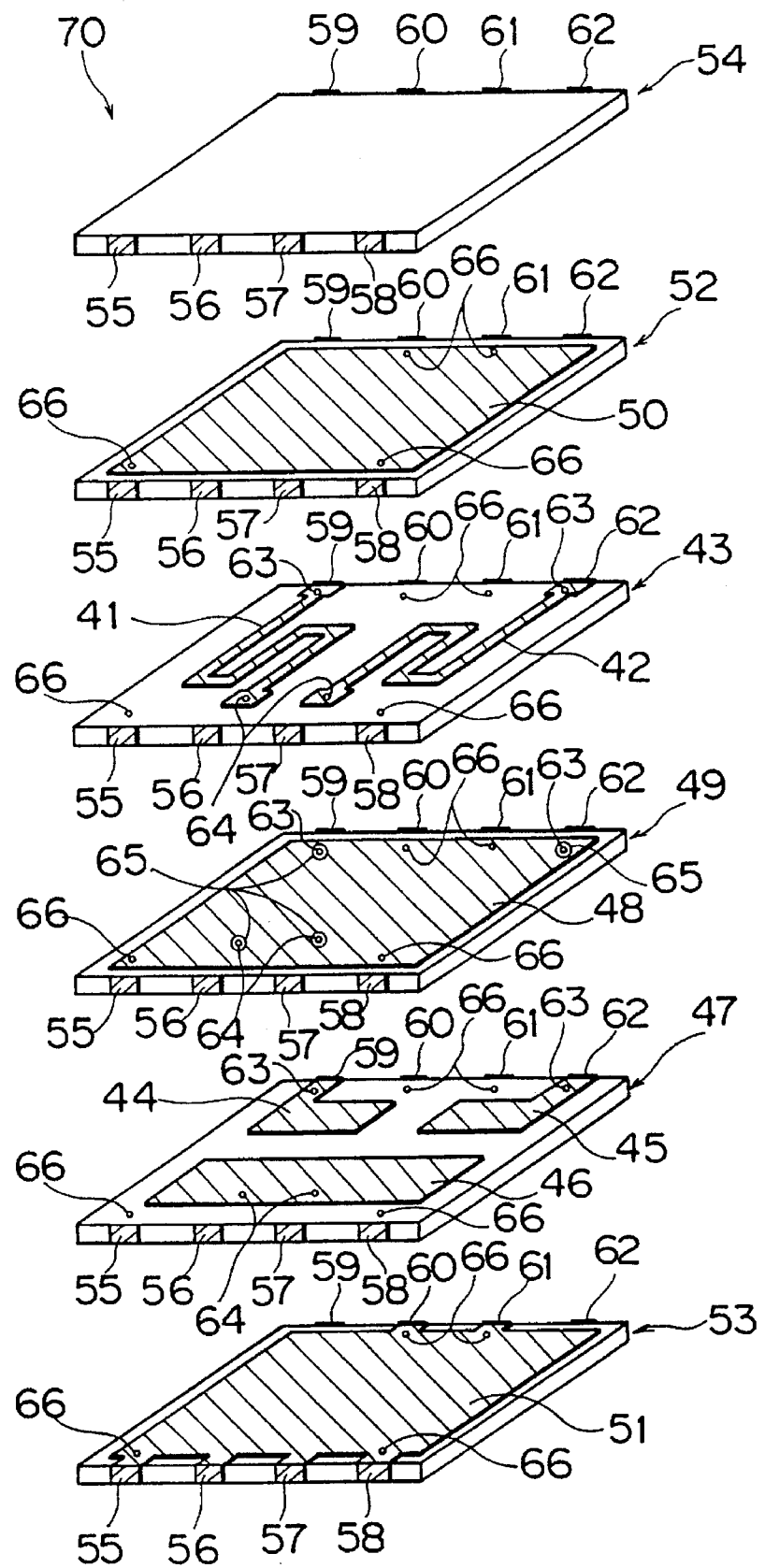
FIG. 4 is an exploded perspective view showing a low-pass filter according to a second embodiment of the present invention.

FIG. 4 is an exploded perspective view showing the low-pass filter 70 according to the second embodiment of the present invention, in correspondence to FIG. 1 showing the first embodiment.

In the low-pass filter 70 according to the second embodiment, a first dielectric substrate 43, a second dielectric substrate 47, a third dielectric substrate 49, a fourth dielectric substrate 53, a fifth dielectric substrate 52, and a dielectric sheet 54 are stacked on each other to form a multilayered chip.

The second embodiment is different from the first embodiment in that the first ends of microstriplines 41 and 42, which are formed on the first dielectric substrate 43, are electrically connected with via-hole electrodes 64 and do not reach the edge of the dielectric substrate 43. The via-hole electrodes 64 pass through the dielectric substrates 43 and 49, and are electrically connected with a capacitor electrode 46. In the dielectric substrate 49, holes 65 are formed in a shielding electrode 48 in order to prevent short-circuiting across the shielding electrode 48 and the via-hole electrodes 64.

Further, according to this embodiment, via-hole electrodes 66 are formed in the multilayered chip. These via-hole electrodes 66 are so formed as to pass through the dielectric substrates 52, 43, 49 and 47 and electrically connect the ground electrode 50, the shielding electrode 48 and ground electrode 51 with each other.

Thus, the shielding electrode 48 is formed on the third dielectric substrate 49 so that its outer peripheral edges do not reach the edges of the dielectric substrate 49. The ground electrode 50 is also formed on the fifth dielectric substrate 52 so that it does not reach the outer peripheral edges of the dielectric substrate 52.

Also in this embodiment, external electrodes 55 to 58 and 59 to 62 are formed on the longer side surfaces of the multilayered chip respectively. Of the external electrodes 55 to 62, external electrodes 55, 58, 60 and 61 are electrically connected with the ground electrode 51. Therefore, the Ground electrode 50 and the shielding electrode 48 are electrically connected with the external electrodes 55, 58, 60 and 61, by way of the electrical connection with the ground electrode 51 and the via-hole electrodes 66.

The second ends of the microstriplines 41 and 42 reaching the other edge of the dielectric substrate 43 are connected with the external electrodes 59 and 62 respectively. The first ends of the microstriplines 41 and 42 are electrically connected with the capacitor electrode 46 by the aforementioned via-hole electrodes 64. Further, capacitor electrodes 44 and 45 are electrically connected with the external electrodes 59 and 62 respectively. In addition, the second ends of the microstriplines 41 and 42 are electrically connected with the capacitor electrodes 44 and 45 respectively by way of via-hole electrodes 63 which are near the outer edge of the dielectric substrate 43.

Therefore, by employing this embodiment of the present invention, it is possible to form a low-pass filter 70 using the external electrodes 59 and 62 as input and output ends respectively and connecting the external electrodes 55, 58, 60 and 61 with ground thereby attaining the effect which was attained in the first embodiment.

A notable feature of the low-pass filter 70 according to the second embodiment of the present invention is that the electrical connection between the microstriplines 41 and 42, the ground electrodes 50 and 51, the shielding electrode 48 and the capacitor electrodes 44 to 46 is attained by the via-hole electrodes 63, 64 and 66. In other words, the electrical connection is at least partially attained by the via-hole electrodes which are formed in the multilayered chip according to this embodiment, while the electrical connect between the respective electrodes is entirely attained by the external electrodes which are formed on the outer surfaces of the multilayered chip in the low-pass filter 30 according to the first embodiment. The other features of this embodiment are similar to those of the first embodiment.

Also in the second embodiment, the fifth dielectric substrate 52 may be omitted. However, it is preferable to shield the low-pass filter 70 against external noises by inserting the fifth dielectric substrate 52.

Although the present invention has been described and illustrated in detail, it is clearly understood that the same is by way of illustration and example only and is not to be taken as a limitation, the spirit and scope of the present invention being limited only by the terms of the appended claims.

What is claimed is:

1. A low-pass filter comprising:
   a plurality of dielectric layers forming a multilayer structure, the multilayer structure comprising:
   a first dielectric substrate having a microstripline on a first surface thereof;

a second dielectric substrate having at least one capacitor electrode on a first surface thereof;

a third dielectric substrate having a thin shielding electrode on a first surface thereof and being arranged between said first and second dielectric substrates said shielding electrode being disposed such that said first dielectric substrate separates said shielding electrode from said microstrip line and said third dielectric substrate separating said capacitor electrode from said shielding electrode;

a dielectric sheet provided on a first surface of said multilayer structure; and a fourth dielectric substrate having a ground electrode on a first surface thereof, the fourth dielectric substrate being disposed on a second surface of said multilayer structure opposite to said first surface of said multilayer structure;

said ground electrode of said fourth dielectric substrate being electrically connected with said shielding electrode of said second dielectric substrate.

2. The low-pass filter in accordance with claim 1, wherein a first capacitor is formed by said at least one capacitor electrode and said ground electrode, and a second capacitor is formed by said at least one capacitor electrode and said shielding electrode, said second capacitor being connected in parallel with said first capacitor.

3. The low-pass filter in accordance with claim 1, further comprising a fifth dielectric substrate having a ground electrode on a first surface thereof and wherein said fifth dielectric substrate is stacked between said dielectric sheet and said first surface of said multilayer structure.

4. The low-pass filter in accordance with claim 1, further comprising an external electrode being formed on an outer surface of said multilayer structure, said external electrode being electrically connected with any one of said microstripline, said capacitor electrode, said ground electrode and said shielding electrode.

5. The low-pass filter in accordance with claim 4, wherein at least three external electrodes are formed on said outer surface of said multilayer structure, for forming a π filter.

6. The low-pass filter in accordance with claim 4, wherein said electric connection between said ground electrode and said shielding electrode is obtained by said external electrode on said outer surface of said multilayer structure.

7. The low-pass filter in accordance with claim 4, wherein a via-hole electrode is formed in said multilayer structure, said ground electrode being electrically connected with said shielding electrode by said via-hole electrode.

8. The low pass filter in accordance with claim 4, wherein a via-hole electrode is formed in said multilayer structure, an end of said microstripline being electrically connected with said capacitor electrode by said via-hole electrode.

9. The low-pass filter in accordance with claim 2, further comprising a fifth dielectric substrate having a ground electrode on a first surface thereof and wherein said fifth dielectric substrate is stacked between said dielectric sheet and said first surface of said multilayer structure.

10. The low-pass filter in accordance with claim 1, further comprising:

a fifth dielectric substrate having a ground electrode on a first surface thereof, said ground electrode having at least one external electrode thereon, and wherein said fifth dielectric substrate is stacked between said dielectric sheet and said first surface of said multilayer structure; and further wherein:

said first dielectric substrate further comprises a first microstripline having first and second external electrodes thereon; and a second microstripline having first and second external electrodes thereon;

said second dielectric substrate further comprises at least a first capacitor electrode having at least one external electrode thereon; a second capacitor electrode having at least one external electrode thereon; and a third capacitor electrode having at least one external electrode thereon;

said shielding electrode of said third dielectric substrate having at least one external electrode thereon;

said ground electrode of said fourth dielectric substrate having at least one external electrode thereon;

said shielding electrode of said third dielectric substrate and said ground electrode of said fourth dielectric substrate and said ground electrode of said fifth dielectric substrate being electrically connected via said external electrodes;

said at least one external electrode of said first capacitor electrode and said first external electrode of said first microstripline being electrically connected;

said at least one external electrode of said second capacitor electrode being connected to said second external electrode of said first microstripline and said second external electrode of said second microstripline;

said at least one external electrode of said third capacitor electrode being connected to said first external electrode of said second microstripline.

* * * * *